United States Patent
Kuo et al.

(10) Patent No.: US 9,882,022 B2
(45) Date of Patent: Jan. 30, 2018

(54) METHOD FOR MANUFACTURING TRANSISTOR WITH SICN/SIOCN MULTILAYER SPACER

(71) Applicant: UNITED MICROELECTRONICS CORP., Hsin-Chu (TW)

(72) Inventors: Chia-Ming Kuo, Kaohsiung (TW); Po-Jen Chuang, Kaohsiung (TW); Fu-Jung Chuang, Kaohsiung (TW); Tsai-Yu Wen, Tainan (TW); Tsuo-Wen Lu, Kaohsiung (TW); Yu-Ren Wang, Tainan (TW); Fu-Yu Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/592,150

(22) Filed: May 10, 2017

(65) Prior Publication Data
US 2017/0243952 A1  Aug. 24, 2017

Related U.S. Application Data

(62) Division of application No. 15/049,133, filed on Feb. 21, 2016, now Pat. No. 9,685,533.

(51) Int. Cl.
| | |
|---|---|
| *H01L 29/66* | (2006.01) |
| *H01L 21/02* | (2006.01) |
| *H01L 21/311* | (2006.01) |
| *H01L 21/28* | (2006.01) |
| *H01L 29/49* | (2006.01) |
| *H01L 29/08* | (2006.01) |
| *H01L 29/16* | (2006.01) |
| *H01L 29/161* | (2006.01) |

(Continued)

(52) U.S. Cl.
CPC .... *H01L 29/66545* (2013.01); *H01L 21/0228* (2013.01); *H01L 21/02126* (2013.01); *H01L 21/02167* (2013.01); *H01L 21/28088* (2013.01); *H01L 21/31111* (2013.01); *H01L 29/0847* (2013.01); *H01L 29/161* (2013.01); *H01L 29/165* (2013.01); *H01L 29/1608* (2013.01); *H01L 29/4966* (2013.01); *H01L 29/6653* (2013.01); *H01L 29/6656* (2013.01); *H01L 29/66795* (2013.01); *H01L 29/7848* (2013.01); *H01L 29/7851* (2013.01)

(58) Field of Classification Search
CPC ......... H01L 29/66545; H01L 21/02126; H01L 21/02167; H01L 21/0228; H01L 21/28088; H01L 21/31111; H01L 29/4966; H01L 29/6653; H01L 29/6656; H01L 29/66795
See application file for complete search history.

(56) References Cited

U.S. PATENT DOCUMENTS

| 2014/0110798 A1 | 4/2014 | Cai | |
| 2014/0235067 A1* | 8/2014 | Shimamoto | C23C 16/36 438/763 |

(Continued)

*Primary Examiner* — Peter Bradford
(74) *Attorney, Agent, or Firm* — Winston Hsu

(57) ABSTRACT

A semiconductor device and a method for manufacturing the same are provided in the present invention. The semiconductor device includes a substrate, a gate structure on the substrate and two spacers on both sidewalls of the gate structure. Each spacer comprises an inner first spacer portion made of SiCN and an outer second spacer portion made of SiOCN.

4 Claims, 5 Drawing Sheets

(51) Int. Cl.
*H01L 29/165* (2006.01)
*H01L 29/78* (2006.01)

(56) References Cited

U.S. PATENT DOCUMENTS

| | | |
|---|---|---|
| 2014/0374827 A1 | 12/2014 | Suh |
| 2016/0141381 A1* | 5/2016 | Kim .................. H01L 29/66545 |
| | | 257/288 |
| 2016/0233310 A1 | 8/2016 | Lee |

* cited by examiner

METHOD FOR MANUFACTURING TRANSISTOR WITH SICN/SIOCN MULTILAYER SPACER

CROSS REFERENCE TO RELATED APPLICATIONS

This application is a divisional of application Ser. No. 15/049,133, filed on Feb. 21, 2016 and entitled "TRANSISTOR WITH SICN/SIOCN MULTILAYER SPACER", which is incorporated herein by reference.

BACKGROUND OF THE INVENTION

1. Field of the Invention

Generally, the present disclosure relates to the manufacture of sophisticated semiconductor devices, and more specifically, to a method of manufacturing a semiconductor device with low-k spacers composed of multilayer and the semiconductor devices incorporating such low-k spacers.

2. Description of the Prior Art

The manufacture of advanced integrated circuits, such as CPUs, storage devices, ASICs (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer. A field effect transistor, whether an NFET or a PFET device, is a planar device that typically includes a source region, a drain region, a channel region that is positioned between the source region and the drain region, a gate insulating layer and a gate electrode positioned above the gate insulating layer over the channel region. By applying an appropriate voltage to the gate electrode, the channel region becomes conductive and current is allowed to flow from the source region to the drain region.

For many early device technology generations, the gate structures of most transistor elements has been comprised of a plurality of silicon-based materials, such as a silicon dioxide and/or silicon oxynitride gate insulating layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. Gate structures that include a so-called high-k dielectric gate insulating layer and one or more metal layers that function as the gate electrode (HK/MG) have been implemented. Such alternative gate structures have been shown to provide significantly enhanced operational characteristics over the heretofore more traditional silicon dioxide/poly-silicon gate structure configurations. One well-known processing method that has been used for forming a transistor with a high-k/metal gate structure is the so-called "gate last" or "replacement metal gate" (RMG) technique.

In a conventional RMG process, spacers at both sides of the dummy poly-silicon gate are vulnerable to the etching process for removing the sacrificial gate insulating layer after the poly-silicon gate electrode is removed. The consumption of the spacers may cause CD (critical dimension) bias on the resulting metal gate structure. Additionally, with the reduction of the width of the spacers due to the consumption, the parasitic capacitance of the semiconductor device would be increased and affects its electrical performance. Therefore, it is necessary for those skilled in the art to develop an effective structure or method to solve this issue.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a gate spacer with two spacer portions respectively made of SiCN and SiOCN. In contrast to conventional gate spacer with one SiOCN composition, the SiCN portion of the gate spacer in the present invention can effectively resist the etch process for removing the sacrificial gate insulating layer. The CD bias issue caused by the consumption of sidewall gate spacer may, therefore, be properly solved.

In one aspect of the embodiments, there is provided a semiconductor device, including a substrate, a gate structure on the substrate, two spacers on both sidewalls of the gate structure with an inner first spacer portion made of SiCN directly contacting the gate structure and an outer second spacer portion made of SiOCN and two epitaxial structures as source/drain at both sides of the two spacers.

In another aspect of the embodiments, there is provided a method for manufacturing a semiconductor device, including steps of providing a substrate, forming a dummy gate structure with a sacrificial gate electrode and a sacrificial gate insulating layer on the substrate, forming a SiCN film over the dummy gate structure and the substrate, forming a SiOCN film over the SiCN film, performing an etch process to the SiCN film and the SiOCN film to form two spacers on both sidewalls of the dummy gate structure, wherein each spacer includes an inner first spacer portion made of the SiCN film directly contacting the dummy gate structure and an outer second spacer portion made of the SiOCN film, removing the sacrificial gate electrode and performing a process for removing the sacrificial gate insulating layer, wherein the process for removing the sacrificial gate insulating layer removes the second spacer portion concurrently.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
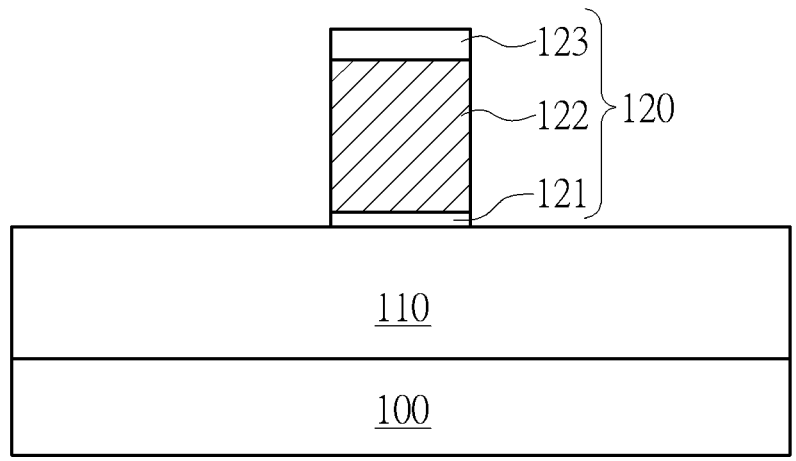
FIG. 1 illustrates a cross-section view of forming a dummy gate structure according to one embodiment.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of manufacturing a semiconductor device according to an embodiment will be described with reference to FIGS. 1 to 8.

The present invention is directed to solve the issue of CD bias caused by spacer consumption during the oxide removal process in replacement metal gate (RMG) process loop, thus the description will be started from the formation of dummy gate structure in early stage. FIG. 1 illustrates a cross-section view of forming such dummy gate structure 120 according to one embodiment of the present invention. Referring to FIG. 1, a substrate 100 is provided to serve as a base for forming the semiconductor device. The substrate 100 may be bulk silicon or an SOI (silicon-on-insulator). Alternatively, the substrate 100 may be a silicon substrate or may contain other materials, e.g., silicon germanium (SiGe), indium antimonide (InSb), a lead telluride compound, indium arsenic (InAs), indium phosphide (InP), gallium arsenide (GaAs), or gallium antimonide (GaSb). Further, the substrate 100 may be formed such that an epitaxial layer is formed on a base substrate.

The fin type active pattern 110 may protrude from the substrate 100. A device isolation layer (not shown) covers a part of a side of the fin type active pattern 110 so that the fin type active pattern 110 may protrude on, e.g., above, the device isolation layer which is formed on the substrate 100. The fin type active pattern 110 may be elongated along a direction perpendicular to the elongated direction of the dummy gate structure 120, so that the dummy gate structure 120 may traverse across multiple fin type active patterns 110. The fin type active pattern 110 may be a part of the substrate 100 or may include an epitaxial layer which is grown from the substrate 100. Please note that this embodiment demonstrates the formation of a fin-type semiconductor device. In other embodiments, for a conventional planar-type semiconductor device, there may be no fin type active patterns 110 formed on the substrate 100.

Referring again to FIG. 1, an etching process is performed using a mask pattern 123 to form a dummy gate structure 120, which extends in a direction intersecting the fin-type active pattern 110. The dummy gate structure 120 includes a sacrificial gate insulating layer 121 and a sacrificial gate electrode 122. For example, the sacrificial gate insulating layer 121 may be a silicon oxide film and the sacrificial gate electrode 122 may be polysilicon. In the embodiment, the sacrificial gate insulating layer 121 and sacrificial gate electrode 122 are prepared to be removed in a later process in order to limit the gate's space and to be replaced with the true metal gate structure.

Figure 2:
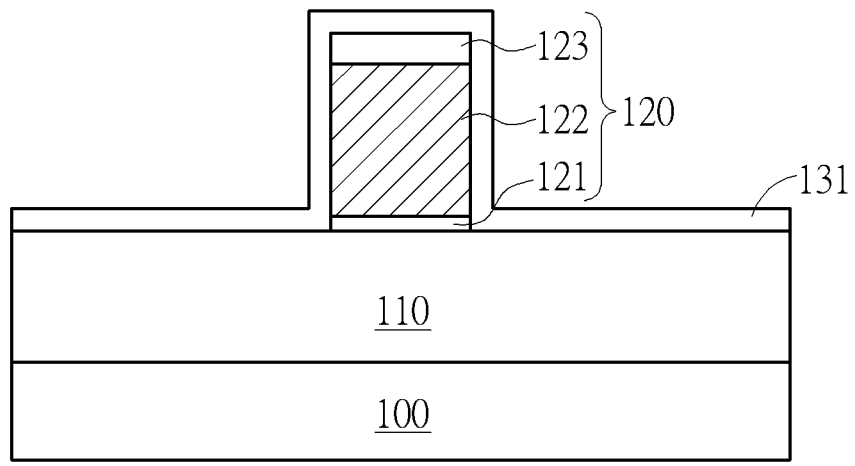
FIG. 2 illustrates a cross-section view of forming a first spacer film made of SiCN according to one embodiment.

Referring to FIG. 2, a first spacer film 131 is formed conformally over the dummy gate structure 120 and the fin-type active pattern 110 with uniform thickness. In the embodiment of the present invention, the first spacer film 131 is specifically made of silicon carbonitride (SiCN). This material has better resistance against the oxygen-based etch process, such as chemical oxide removal (COR) process, which is primarily used to remove the sacrificial gate insulating layer in conventional RMG process loop. The first spacer film 131 may be formed using conventional chemical vapor deposition method (CVD), or using atomic layer deposition method (ALD) with precursors of HCD (hexa-chloro-disilane), C3H6 and NH3 through multiple cycles. The SiCN-based first spacer film 131 has a low dielectric constant (low-K) from a value of 4 or larger and 6 or smaller, which is quite lower than that of the silicon nitride and induces lesser parasite capacitance. For the simplicity of the description, the LDD (lightly-doped drain) components and relevant process are omitted in the embodiment.

Figure 3:
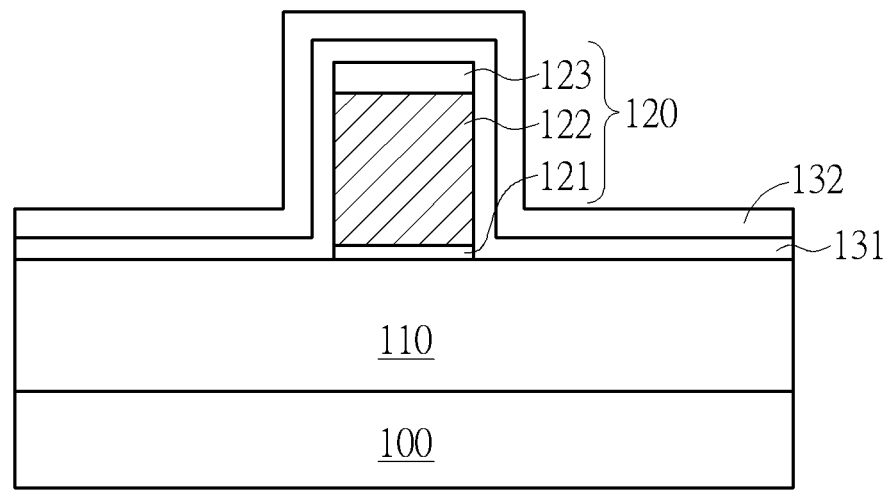
FIG. 3 illustrates a cross-section view of forming a second spacer film made of SiOCN according to one embodiment.

Referring now to FIG. 3, a second spacer film 132 is formed conformally over the first spacer film 131. This second spacer film 132 will be shaped concurrently with the first spacer film 131 into spacers in a later process. In the embodiment of the present invention, the second spacer film 132 is specifically made of silicon oxycarbonitride (SiOCN). This material is conventional low-K material for gate spacers and has poor resistance against the oxygen-based etch process in comparison to SiCN. This resistance difference may provide considerable selectivity in the oxygen-based etch process to serve our purpose.

Like the first spacer film 131, the second spacer film 132 may be formed using conventional CVD method or ALD method through multiple cycles. Preferably, in some embodiments, the first spacer film 131 and second spacer film 132 may be integrated in the same step, e.g., in one recipe. For example, by using the ALD method with precursors of HCD, $C_3H_6$ and $NH_3$ through multiple cycles, the parameters of the ALD method are tunable to control and form a multilayer spacer films consisting both of spacer films 131 and 132, of which multilayer have gradient concentration of SiOCN increasing from the side adjacent to the fin-type active pattern 110 and the dummy gate structure 120 to the outer surface of spacer film 132. Please note that, in the embodiment, the gradient concentration of SiOCN substantially means that the concentration of SiOCN in the spacer films 131/132 would increase as the concentration of SiCN decreases from the substrate to the outer surface. If the composition of SiOCN is dominant in one film, that film would be referred as a SiOCN or SiOCN-based spacer film, and vice versa.

Figure 4:
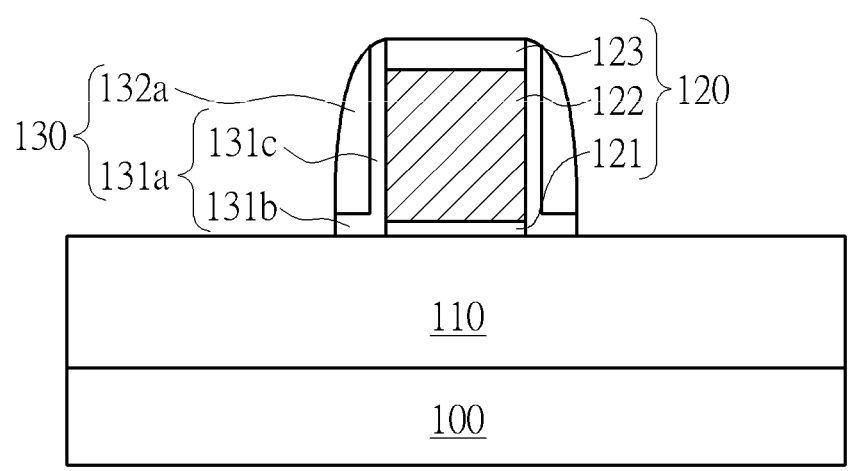
FIG. 4 illustrates a cross-section view of forming two spacers made of a SiCN portion and a SiOCN portion on both sidewalls of the dummy gate structure according to one embodiment.

Referring to FIG. 4, after the spacer films 131 and 132 are formed, an etching process is performed to shape two spacer films 131 and 132 self-alignedly into two gate spacer 130 respectively on sidewalls of the dummy gate structure 120. Since there are two kinds of spacer films 131a/132a provided in the present invention, each spacer 130 resulted from the spacer films 131a/132a would include a first spacer portion 131a made of SiCN and a second spacer portion 132a made of SiOCN. More specifically, the inner first spacer portion 131a is in L-shaped with a horizontal section 131b between the second spacer portion 132a and the fin-type active pattern 110 and a vertical section 131c between the second spacer portion 132a and the dummy gate structure 120. The outer second spacer portion 132a is in standard shape of the gate spacer.

Figure 5:
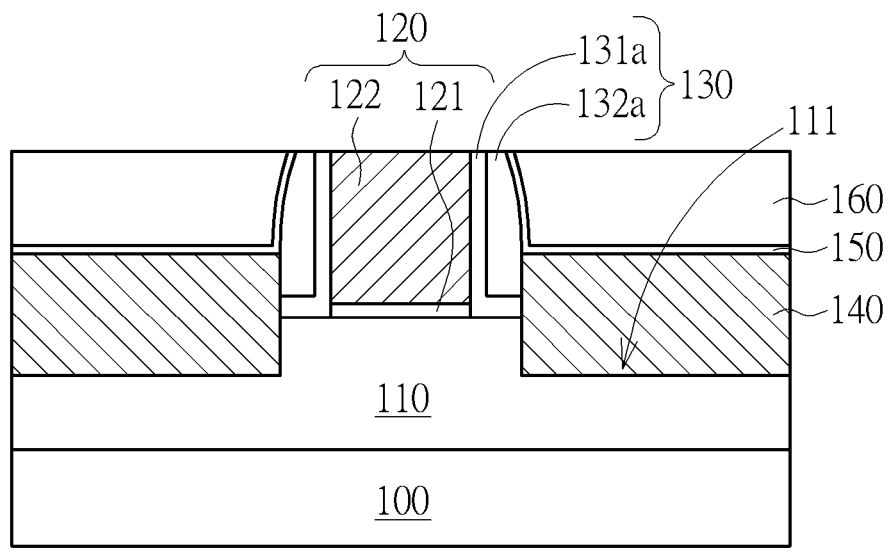
FIG. 5 illustrates a cross-section view of forming two epitaxial structures, a blocking film, and a first interlayer insulating layer according to one embodiment.

Referring to FIG. 5, after gate spacers 130 are formed, a part of the upper portion of the fin-type active pattern 110 which protrudes above the device isolation layer (not shown) is etched to form recesses 111 at both sides of the dummy gate structure 120. Before the recesses 111 are formed, additional sacrificial SiN films (not shown) may be formed during or after the formation of the gate spacers 130 to define the spacing between the epitaxial structures and the gate structure. These recesses 111 are prepared for the epitaxial structures to be formed in a later process. Two elevated epitaxial structures 140 are grown respectively in the recesses 111 from the fin-type active patterns 110. Theses elevated epitaxial structures 140 serve as source/drain region of the semiconductor device. The material for the elevated epitaxial structures 140 may vary depending on whether the semiconductor devices according to embodiments are n-type transistors or p-type transistors. When the semiconductor device is a PMOS fin type transistor, the elevated epitaxial structures 140 may include a compressive stress material. For example, the compressive stress material may be a material which has a larger lattice constant than Si, e.g., SiGe. The compressive stress material applies a compressive stress to the fin type active pattern 110 to improve a mobility of a carrier of a channel region. In contrast, when the semiconductor device is an NMOS fin type transistor, the elevated epitaxial structures 140 may be formed of the same material as the substrate 100 or of a tensile stress material. For example, when the substrate 100 is Si, the epitaxial structures 140 may be Si or a material which has a lower lattice constant than Si, e.g., SiC). Further, if necessary, an impurity may be doped in situ during the epitaxial process.

The elevated epitaxial structures 140 may have at least one of a diamond shape, a circular shape and a rectangular shape. A blocking film 150 is then conformally formed over the elevated epitaxial structures 140, the gate spacer 130 and the dummy gate structure 120. This blocking film 150 may serve as a contact etch stop layer (CESL) during the contact holes stage. Additionally, in the planarizing process, the blocking film 150, in which is formed the profile of the gate spacers 130, may support the gate spacers 130 so as not to deform a shape of the upper portion of the gate spacers 130. The blocking film 150 may be a single layer which is formed of a SiOCN film, SiCN film, SiN film, SiO2 film or the combination thereof. A first interlayer insulating layer 160 is then formed over the blocking film 150. The first interlayer insulating layer 160 may include at least one of a material having a low dielectric constant, an oxide film, a nitride film, and an oxynitride film. For the simplicity of the description, the source/drain region and relevant process are omitted in the embodiment.

Next, as shown in FIG. 5, the first interlayer insulating layer 160 is planarized, e.g. a CMP process, until the top surface of the sacrificial gate electrode 122 is exposed. As a result, the mask pattern 123 is removed from the top surface of the sacrificial gate electrode 122. A part of gate spacers 130 and blocking film 150 are also removed in this process. The exposed sacrificial gate electrode 122 is ready to be removed in the following RMG process.

Figure 6A:
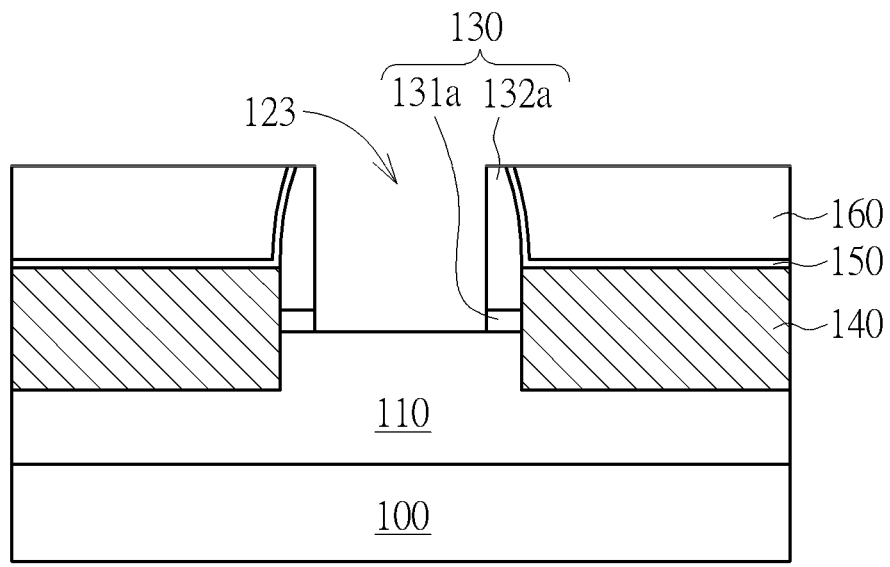
FIG. 6A illustrates a cross-section view of removing the dummy gate structure according to one embodiment.

Referring to FIG. 6A, the sacrificial gate insulating layer 121 and the sacrificial gate electrode 122 are removed. By removing the sacrificial gate insulating layer 121 and the sacrificial gate electrode 122, a trench 123 which exposes a part of the device isolation layer (not shown) and the fin-type active pattern 110 is formed between the gate spacers 130. These trenches 123 will provide and limit the spaces for the formation of metal gate structures in a later RMG process loop.

Please note that, in the embodiment shown in FIG. 6A, the vertical section 131c of the first spacer portion 131a is completely removed. In this case, the SiCN-based first spacer portion 131a serves as a sacrificial film for the adjacent SiOCN-based second spacer portion 132a in the dummy gate removing process. The consumption of gate spacers in dummy gate removing process is very critical to the critical dimension (CD) of the semiconductor device.

The more the consumption of the gate spacers, the larger the CD bias deviated from the predetermined value. Furthermore, the thinned gate spacers may also induce larger parasite capacitance, which may impact the electrical performance of the device.

The SiCN material has a considerably low wet etching rate in the oxygen-based etch process in comparison to the SiOCN material (about 1:6), such as in reactive ion etch (RIE) process, wet etch process, SiCoNi etch process, and more specifically, in chemical oxide removal (COR) process conventionally used for removing the dummy gate insulating layer 121. For this reason, the inner SiCN— based first spacer portion 131a can effectively resist against the etch process and protect the outer SiOCN-based second spacer portion 132a from being over-etched by the removing process. In this embodiment, as shown in FIG. 6A, the vertical section 131c of the first spacer portion 131a is completely removed and only the horizontal section 131b of the first spacer portion 131a remains between the second spacer portion 132a and the substrate 110 after the dummy gate removing process.

Figure 6B:
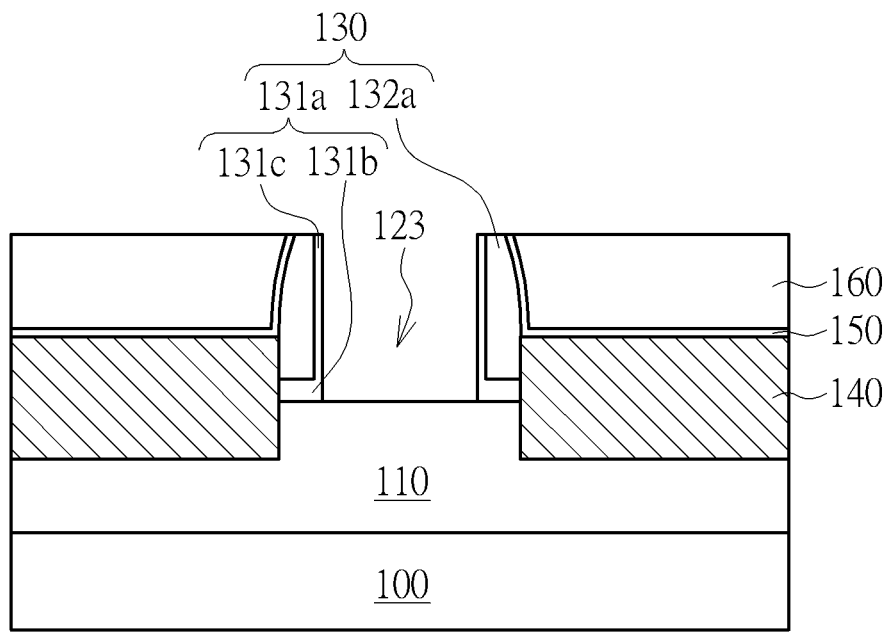
FIG. 6B illustrates a cross-section view of removing the dummy gate structure according to another embodiment.

Alternatively, please refer to FIG. 6B, the vertical section 131c of the first spacer portion 131a may remain after the removing process in other embodiments. In this case, the vertical section 131c of the first spacer portion 131a would not be completely consumed by the etch process. The thickness of the vertical section 131c may be slightly decreased, but the vertical section 131c of SiCN spacer remains on the second spacer portion 132a and limits the gate's space.

In either case of FIG. 6A or FIG. 6B, since the second spacer portion 132a is not subject to any etching effect during the dummy gate removing process, the thickness of SiCN-base first spacer 131a may be properly controlled to achieve the purpose of maintaining the critical dimension for the semiconductor device we want. The variants of gradient concentration of SiOCN from SiCN spacer portion 131a to SiOCN spacer portion 132a in multilayer spacer structure may also achieve this purpose of invention.

Figure 7:
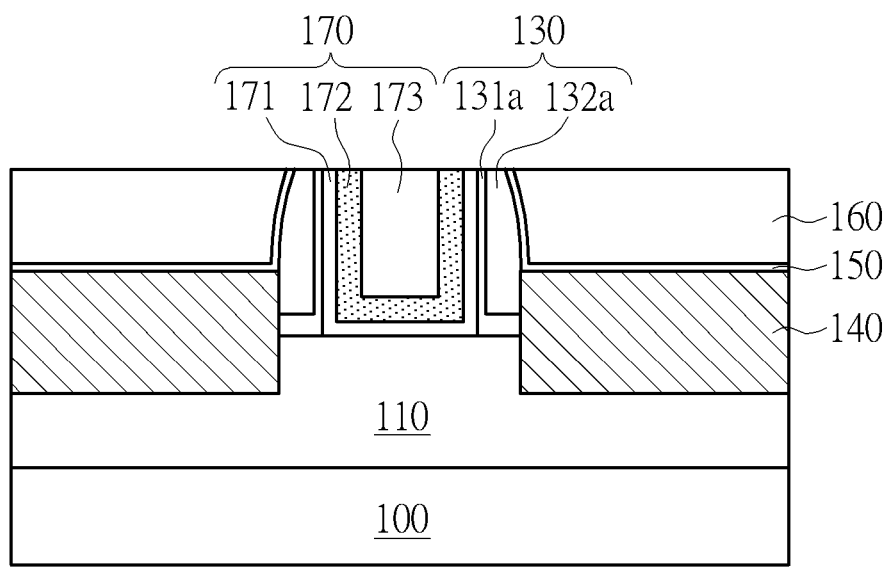
FIG. 7 illustrates a cross-section view of forming a gate structure according to one embodiment.

Referring to FIG. 7, the replacement metal gate structure 170 is formed in the trench 123 confined by the gate spacers 130. First, the gate insulating layer 171 is formed in the trench 123. The gate insulating layer 171 may include a high dielectric material having a higher dielectric material than the silicon oxide film. For example, the gate insulating layer 171 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto. The gate insulating layer 171 may be substantially conformally formed along the side wall and the bottom surface of the trench 123. Optionally, an interfacial oxide layer (not shown) may be grown before the gate insulating layer 171 to increase the adhesion between the gate insulating layer 171 and the fin-type pattern 110.

A work function layer 172 may be formed by two or more metal layers laminated thereon. The work function layer 172 controls the work function of the metal gate and a metal layer 173 fills up the trench confined by the work function layer 172. The work function layer 172 and the metal layer 173 serve as the gate electrode of the device. For example, the work function layer 172 may include at least one of TiN, TaN, TiC and TaC depending on the type of MOS. Further, the metal layer 173 may include W or Al. Alternatively, the gate electrode may be formed of Si or SiGe rather than a metal.

Figure 8:
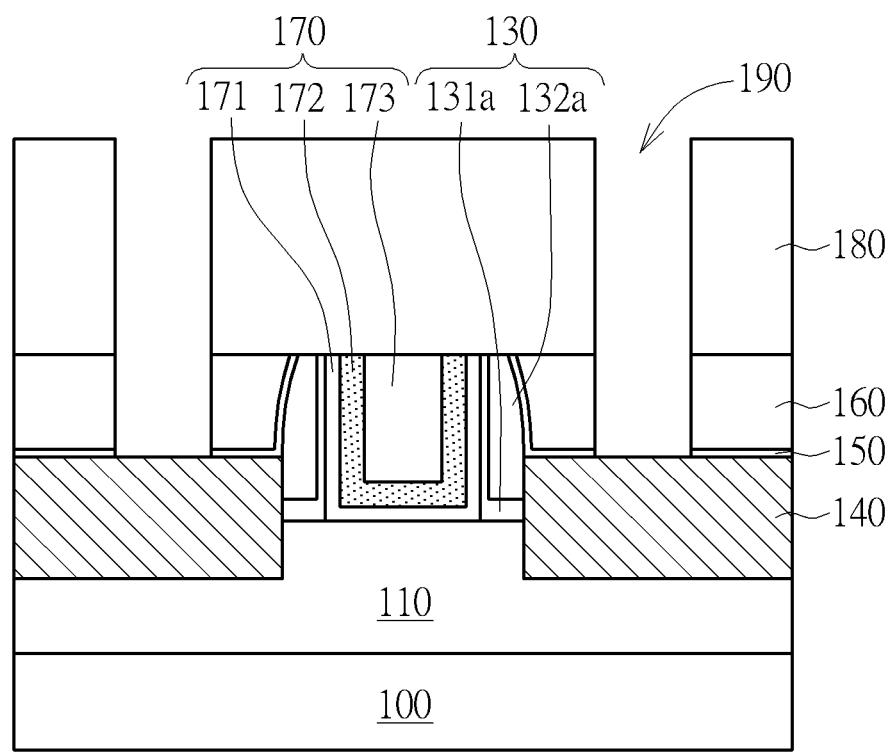
FIG. 8 illustrates a cross-section view of forming a second interlayer insulating layer and contacts on the semiconductor device according to one embodiment.

Referring to FIG. 8, the second interlayer insulating layer 180 is formed on the first interlayer insulating layer 161 and the gate structure 120. The second interlayer insulating layer 180 may include at least one of a material having a low dielectric constant, an oxide film, a nitride film, and an oxynitride film. Examples of the material having a low dielectric constant may include FOX (flowable oxide), TOSZ (tonen silazene), USG (undoped silica glass), BSG (borosilica glass), PSG (phosphosilica glass), BPSG (borophosphosilica glass), PRTEOS (plasma enhanced tetra ethyl ortho silicate), FSG (fluoride silicate glass), HDP (high density plasma), PEOX (plasma enhanced oxide), FCVD (flowable CVD) and a combination thereof.

Next, contact holes 190 are formed to pass through the second interlayer insulating layer 180 and the first interlayer insulating layer 160. Since the first interlayer insulating layer 160 and the blocking film 150 having an etching selectivity are formed on the elevated epitaxial structure (i.e. source/drain region) 140, the contact hole 190 does not expose the elevated epitaxial structure 140. In other words, the blocking film 162 which has a low dielectric constant serves as an contact etch stop layer (CESL) when the contact hole 181a is formed.

Referring again to FIG. 8, the blocking film 150 which is exposed by the contact hole 190 is removed to expose the elevated epitaxial structure 140. The contact hole 190 is filled with a conductive material to form a contact on the exposed elevated epitaxial structure 140. The elevated epitaxial structure 140 and the contact are electrically connected to each other. The contact may include Al, Cu, and W, but is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a substrate;
   forming a dummy gate structure on said substrate, wherein said dummy gate structure comprises a sacrificial gate electrode and a sacrificial gate insulating layer;
   forming a SiCN film over said dummy gate structure and said substrate;
   forming a SiOCN film over said SiCN film, wherein said SiCN film and said SiOCN film are multilayer films formed in the same step by atomic layer deposition, and said multilayer films have gradient concentrations of oxygen increasing from the boundary between said first spacer portion and said gate structure to the outer surface of said second spacer portion;
   performing an etch process to said SiCN film and said SiOCN film to form two spacers on both sidewalls of said dummy gate structure, wherein each said spacer comprises an inner first spacer portion made of said SiCN film directly contacting said dummy gate structure and an outer second spacer portion made of said SiOCN film, and said first spacer portion is L-shaped with a vertical section between said second spacer portion and said dummy gate structure and a horizontal section between said second spacer portion and said substrate;

removing said sacrificial gate electrode; and performing a process for removing said sacrificial gate insulating layer, wherein said process for removing said sacrificial gate insulating layer removes said vertical section of said first spacer portion concurrently.

2. The method of manufacturing a semiconductor device of claim 1, wherein said process for removing said sacrificial gate insulating layer is a chemical oxide removal process.

3. The method of manufacturing a semiconductor device of claim 1, wherein said process for removing said sacrificial gate insulating layer concurrently completely removes said vertical section of said first spacer portion of each said spacer.

4. The method of manufacturing a semiconductor device of claim 1, further comprising steps of forming a gate structure after said dummy gate structure is removed, wherein said gate structure comprises a gate insulating layer, a work function layer and a metal layer.

* * * * *